United States Patent [19]

Geddes et al.

[11] Patent Number: 5,336,923
[45] Date of Patent: Aug. 9, 1994

[54] VARACTOR DIODE HAVING A STEPPED CAPACITANCE-VOLTAGE PROFILE

[75] Inventors: John J. Geddes, Minneapolis; Donald R. Singh, Dakota, both of Minn.

[73] Assignee: Honeywell, Inc., Minneapolis, Minn.

[21] Appl. No.: 999,247

[22] Filed: Dec. 31, 1992

[51] Int. Cl.⁵ .............................................. H01L 29/92
[52] U.S. Cl. .................................. 257/596; 257/595; 257/480; 257/12; 257/14
[58] Field of Search .............................. 257/595–602, 257/312, 480, 497, 498, 22, 14, 12, 19, 28, 20

[56] References Cited

U.S. PATENT DOCUMENTS

| 4,902,912 | 2/1990 | Capasso et al. | 257/22 |
| 5,153,682 | 10/1992 | Goto et al. | 257/20 |
| 5,166,766 | 11/1992 | Grudtowski et al. | 257/22 |
| 5,216,260 | 6/1993 | Schubert et al. | 257/12 |

FOREIGN PATENT DOCUMENTS 2299274 11/1990 Japan.

*Primary Examiner*—Jerome Jackson
*Assistant Examiner*—Nathan K. Kelley
*Attorney, Agent, or Firm*—John G. Shudy, Jr.

[57] ABSTRACT

A varactor diode having a stepped capacitance-voltage profile, formed in heterostructural integrated circuit technology. Several layers in the diode structure have pulse doping to confine conduction in the diode to a sheet of charge that provides the stepped capacitance-voltage profile. The structural design of the diode may be modified to attain desired capacitance-voltage characteristics.

6 Claims, 2 Drawing Sheets

VARACTOR DIODE HAVING A STEPPED CAPACITANCE-VOLTAGE PROFILE

BACKGROUND OF THE INVENTION

The present invention pertains to varactor diodes, and in particular pertains to diodes having particular capacitance to voltage characteristics.

Typical varactor diodes have continuous capacitance to voltage characteristics or profiles. The profiles are such that the capacitance changes according to variations of the voltage applied across the diode. Planar varactor diodes of the related art that have been used in integrated circuits typically have a quality factor or Q that degrades significantly as the diode is depleted due to an increased series resistance in the diode.

SUMMARY OF THE INVENTION

The present invention is a varactor diode having a capacitance versus voltage profile wherein the capacitance is constant for various ranges of voltage applied across the diode. The invention also has a low series resistance relative to the conventional planar varactor diode. The invention uses heterostructure integrated circuit technology with pulse doping to confine conduction in the diode to a sheet of charge which provides an abrupt change in capacitance when a charge layer is depleted by the voltage across the diode. That abrupt change in capacitance is regarded as "punch through". For voltages across the diode that are not near the punch-through regions, the capacitance remains fairly constant for a variation of voltage. This characteristic makes the diode greatly applicable to phase shifters, oscillators and frequency multipliers.

DESCRIPTION OF THE PREFERRED EMBODIMENT

Figure 1:
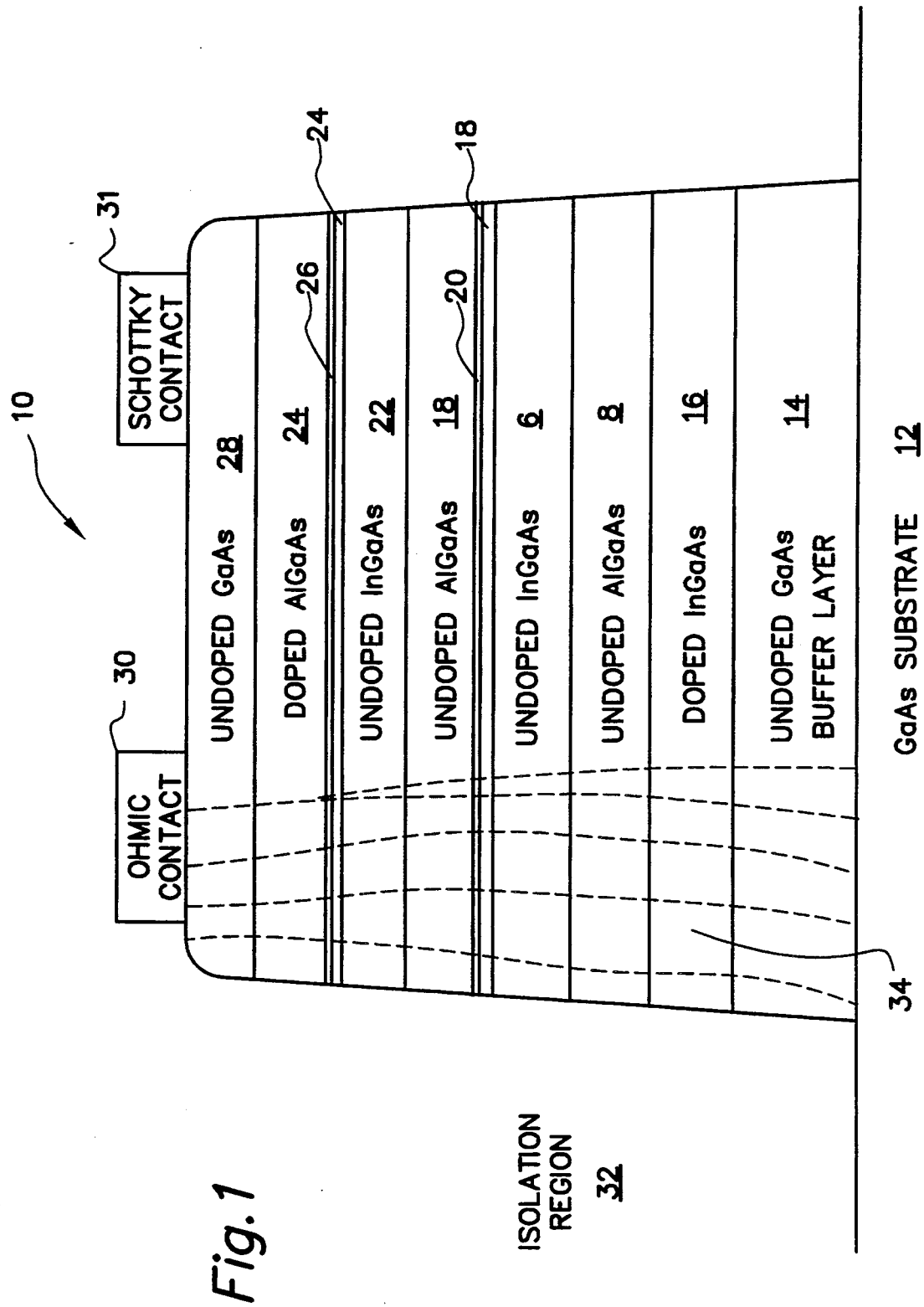
FIG. 1 is a cross section of a planar varactor diode embodying the present invention.

FIG. 1 shows the structure of the varactor diode 10 of the present invention. Device 10 is molecular beam epitaxy (MBE) grown on a GaAs substrate 12. The first layer on substrate 12 is a buffer layer 14 of undoped GaAs grown to isolate subsequent layers from defects and impurities in substrate 12. The second layer on substrate 12 is a doped InGaAs layer 16. Layer 16 is doped to provide a low device series resistance in the fully depleted state. On layer 16 is grown an undoped AlGaAs layer 8. An undoped InGaAs layer 6 is grown on layer 8 followed by another undoped AlGaAs layer 18. A non-doped InGaAs layer 22 is formed on layer 18. A doping pulse or layer 20 of 50 angstroms of undoped silicon (Si) is embedded in the undoped AlGaAs layer 18 at a distance of 20 to 30 angstroms from the junction of the undoped AlGaAs layer 18 and undoped InGaAs layer 6. Layer 18 can be referred to as a pulse doped region as a result of embedded doping pulse 20. Formed on layer 18 is an undoped InGaAs layer 22. On layer 22 is doped AlGaAs layer 24. Layer 24 may be referred to as a pulsed doped region as a result of doping pulse or layer 26, similar to pulse or layer 20, that is at a distance of 20 to 30 angstroms from the junction of layers 22 and 24. On layer 24 is formed an undoped GaAs layer 28 to prevent oxidation of the underlying AlGaAs layer 24.

Situated on layer 28 is an ohmic contact 30 which is made using an Au/Ge/Ni contact metalization as is typically used in GaAs devices. Schottky contact 31 is formed with a Ti/Pt/Au metallization typically used in GaAs devices. Device 10 is encircled with isolation by mesa etching (e.g., chemical etch such as HCl: $H_2O_2$:- $H_2O$ in proportions of 1:4:40) or by ion bombardment (e.g., hydrogen, oxygen or boron) in areas such as region 32. Normally only one type of isolation is used for isolating device 10. Ion (e.g., silicon) implantation may be applied beneath contact 30 in region 34. Region 34 is doped by ion implantation to decrease device 10 resistance.

AlGaAs/InGaAs heterostructure device 10 on GaAs substrate 12 as shown in FIG. 1 is the preferred embodiment of the invention. However, other layer structures such as AlGaAs/GaAs on GaAs substrates or InAlAs-/InGaAs on InP substrates may also be used to attain similar performance results as those of varactor diode 10.

The thicknesses of the layers of structure 10 are determined in part by the capacitance change desired. The thicknesses of AlGaAs layers 8, 18 and 24 and of InGaAs layers 6 and 22 determine the capacitance per unit area. The thicknesses of AlGaAs layers 18 and 24 affect the voltage required to "punch through" the doping pulse. Increasing the thicknesses of one or both of AlGaAs layers 18 and 24 decreases the capacitance per unit area and increases the voltage required to punch through the charge layer. The sum of the thicknesses of layers 28, 24, 22, 18, 6 and 8 must be such that the voltage required to deplete all of the charge in pulsed doped layers 20 and 26 is less than the breakdown voltage of the device. This voltage is also influenced by the size of the doping pulses (i.e., the number of charge carriers per square centimeter). Higher doping reduces the series resistance of the device at the expense of a higher "punch-through" voltage. Selection of the optimum number of doping pulses, layer thicknesses and doping may vary from one application to another.

Typical layer thicknesses and doping are as follows: layer 28 is 150 angstroms thick; layer 24 is 300 angstroms thick; doping pulse 26 is $2 \times 10^{12}$ charge carriers per square centimeter; layer 22 is 150 angstroms thick; layer 18 is 300 angstroms thick; doping pulse 20 is $1 \times 10^{12}$ charge carriers per square centimeter; layer 6 is 150 angstroms thick; layer 8 is 300 angstroms thick; layer 16 is 150 angstroms thick; doping in layer 16 is $2 \times 10^{18}$ atoms per cubic centimeter; and layer 14 is 5000 angstroms thick.

Figure 2:
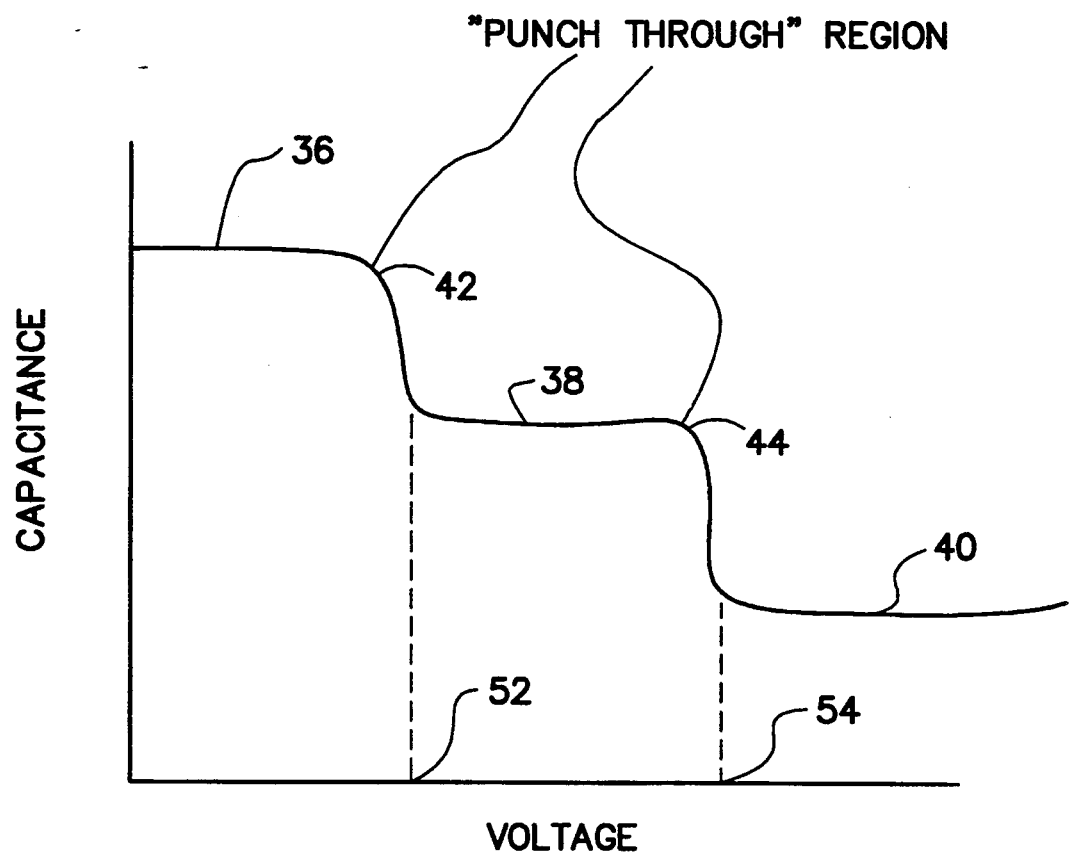
FIG. 2 is a capacitance voltage graph revealing functional characteristics of the device shown in FIG. 1.

FIG. 2 is a graph showing the relationship between the capacitance and voltage across device 10. The graph shows that for device 10 having two pulse doping regions 20 and 26, it has three capacitance steps 36, 38 and 40. The capacitances are constant for several ranges of voltages. When there is a capacitance change with a change of voltage, it is a sudden change of capacitance and it occurs at the "punch through" region points 42 and 44 which results in three capacitance steps.

The capacitance (C) per unit area (A) is determined by e/d, where "d" is the layer thickness (t) and "e" is the dielectric constant of the layer material. In actuality, the dielectric constants for InGaAs and AlGaAs are not the same but for approximation purposes can be assumed to be the same here. So, for region 36 of FIG. 2, $C/A = e/(t_{28} + t_{24})$, which is about 2.4 femtofarad per square micron; for region 38, C/A-

$=e/(t_{28}+t_{24}+t_{22}+t_{18})$, is about 1.2 femtofarad per square micron; and for region 40, $C/A=e/(t_{28}+t_{24}+t_{22}+t_{18}+t_6+t_8)$, is about 0.8 femtofarad per square micron.

The voltage required to "punch through" the doping pulse can be calculated using Poissons equation. Assuming the same dielectric constant for InGaAs and AlGaAs, the relevant equation is $V_p=(qN_sd)/e$, where "q" is the charge on an electron, "$N_s$" is the sheet charge density, and "d" is the distance (i.e., thickness) between the Schottky contact and the doping pulse. In FIG. 2, $V_{52}=[qN_{s52}(t_{28}+t_{24})]/e$, is about 1.4 volts; and $V_{54}=\{[qN_{s52}(t_{28}+t_{24})]/e\}+\{[qN_{s54}(t_{28}+t_{24}+t_{22}+t_{18})]/e\}$, is about 2.8 volts.

Additional pulse doped layers can be added for additional capacitance steps. Device can be biased away from the "punch through" region to assure constant capacitance over a given range of voltage applied across diode 10. The "punch through" region may be referred to as a transition region. Device 10 can be set to have a low series resistance in any one of its states by biasing device 10 away from the "punch through" region.

We claim:

1. A heterostructure varactor diode having a stepped capacitance-voltage profile, comprising:
   a GaAs substrate;
   a first undoped GaAs layer formed on said GaAs substrate;
   a doped InGaAs layer formed on said first undoped GaAs layer;
   a first undoped AlGaAs layer formed on said doped InGaAs layer;
   a first undoped InGaAs layer formed on said first undoped AlGaAs layer;
   a second undoped AlGaAs layer formed on said first undoped InGaAs layer;
   a first undoped silicon layer formed on said second undoped AlGaAs layer;
   a third undoped AlGaAs layer formed on said first undoped silicon layer;
   a second undoped InGaAs layer formed on said third undoped AlGaAs layer;
   a first doped AlGaAs layer formed on said second undoped InGaAs layer;
   a second undoped silicon layer formed on said first doped AlGaAs layer;
   a second doped AlGaAs layer formed on said second layer of undoped silicon; and
   a second undoped GaAs layer formed on said second doped AlGaAs layer.

2. The diode of claim 1 further comprising:
   a Schottky contact on said second undoped GaAs layer; and
   an ohmic contact on said second undoped GaAs layer.

3. The diode of claim 2 comprising an ion-doped region for forming said ohmic contact.

4. A varactor diode comprising:
   a GaAs substrate;
   a first undoped GaAs layer formed on said GaAs substrate;
   a doped InGaAs layer formed on said first undoped GaAs layer;
   at least one multiple layer, formed on said doped InGaAs layer, said multiple layer comprising:
      a first undoped AlGaAs layer;
      a first undoped InGaAs layer;
      a second undoped AlGaAs layer formed on said first layer of undoped InGaAs;
      a first undoped silicon layer formed on said second undoped AlGaAs layer;
      a third undoped AlGaAs layer formed on said first undoped silicon layer;
      a second undoped InGaAs layer formed on said third undoped AlGaAs layer;
      a first doped AlGaAs layer formed on said second undoped InGaAs layer;
      a second undoped silicon layer formed on said first doped AlGaAs layer; and
      a second doped AlGaAs layer formed on said second undoped silicon layer; and
   a second undoped GaAs layer formed on said multiple layer.

5. A heterostructure varactor diode (10) having a stepped capacitance-voltage profile, comprising:
   a GaAs substrate (12);
   an approximately 5,000 angstrom thick undoped GaAs buffer layer (14) formed on said GaAs substrate (12);
   an approximately 150 angstrom thick doped InGaAs layer (16) formed on said undoped GaAs buffer layer (14);
   a first approximately 300 angstrom thick undoped AlGaAs layer (8) formed on said doped InGaAs layer (16);
   a first approximately 150 angstrom thick undoped InGaAs (6) formed on said first undoped AlGaAs layer (8);
   a second approximately 30 angstrom thick undoped AlGaAs layer (18) formed on said first undoped InGaAs layer (6);
   a first approximately 50 angstrom thick undoped Si layer (20) formed on said second undoped AlGaAs layer (18);
   a third approximately 250 angstrom thick undoped AlGaAs layer (18) formed on said first undoped Si layer (20);
   a second approximately 150 angstrom thick undoped InGaAs layer (22) formed on said third undoped AlGaAs layer (18);
   a first approximately 30 angstrom thick doped AlGaAs layer (24) formed on said second undoped InGaAs layer (22);
   a second approximately 50 angstrom thick undoped Si layer (26) formed on said first undoped AlGaAs layer (24)
   a second approximately 250 angstrom thick doped AlGaAs layer (24) formed on said second undoped Si layer (26);
   a 150 angstrom thick undoped GaAs layer (28) formed on said third undoped AlGaAs layer (24);
   a Schottky contact (31) formed with Ti/Pt/Au metallization on said undoped GaAs layer (28); and
   an ohmic contract (30) formed with Au/Ge/Ni metallization on said undoped GaAs layer (28); and
wherein:
   a region (34) between said ohmic contact (30) and said substrate (12) is doped by ion implantation; and
   said device (10) has a form of a mesa on said substrate (12).

6. The diode of claim 5 wherein:
   said first undoped silicon layer (20) has about $1 \times 10^{12}$ charge carriers per square centimeter; and
   said second undoped silicon layer (26) has about $2 \times 10^{12}$ charge carriers per square centimeter.

* * * * *